(12) United States Patent
Lai

(10) Patent No.: US 8,587,940 B2
(45) Date of Patent: Nov. 19, 2013

(54) SERVER WITH FAN MODULE

(75) Inventor: Yu-Chia Lai, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 196 days.

(21) Appl. No.: 13/043,475

(22) Filed: Mar. 9, 2011

(65) Prior Publication Data

US 2012/0155009 A1   Jun. 21, 2012

(30) Foreign Application Priority Data

Dec. 15, 2010   (TW) .............................. 99144111 A

(51) Int. Cl.
| | |
|---|---|
| H05K 5/00 | (2006.01) |
| H05K 7/00 | (2006.01) |
| H05K 7/20 | (2006.01) |
| A47B 77/08 | (2006.01) |
| F24F 7/007 | (2006.01) |

(52) U.S. Cl.
USPC .............. 361/679.33; 361/679.47; 361/679.5; 361/692; 312/236; 454/186

(58) Field of Classification Search
USPC ........... 361/79.46–679.51, 688–699; 454/184
See application file for complete search history.

(56) References Cited

U.S. PATENT DOCUMENTS

| | | | |
|---|---|---|---|
| 2002/0126449 A1* | 9/2002 | Casebolt ....................... | 361/687 |
| 2005/0128710 A1* | 6/2005 | Beitelmal et al. ............. | 361/709 |
| 2008/0106867 A1* | 5/2008 | Abe et al. ...................... | 361/695 |

* cited by examiner

*Primary Examiner* — Jayprakash N Gandhi
*Assistant Examiner* — Jerry Wu
(74) *Attorney, Agent, or Firm* — Altis & Wispro Law Group, Inc.

(57) ABSTRACT

A server includes a server enclosure having an accommodating room with a front area and a rear area and a top plate defining a first intake hole communicating with the accommodating room, a first component module and a second component module respectively at the front and rear areas, a first fan module and a second fan module in the accommodating room. The first fan module is for forcing air to flow from the front area to the rear area. The second fan module includes an air-guiding housing and a fan inside the air-guiding housing. The air-guiding housing has a second intake hole aligned with the first intake hole, and an exhaust hole opening toward the rear area. The fan draws air outside the server enclosure through the first and second intake holes, and blows the air toward the rear area through the exhaust hole.

13 Claims, 3 Drawing Sheets

SERVER WITH FAN MODULE

BACKGROUND

1. Technical Field

The present disclosure relates to a server with fan module.

2. Description of Related Art

A server typically includes at least one hard disk drive (HDD) array in the front area of the server, a power supply device and a motherboard module arranged in the rear area of the server. Considerable heat is generated during operation of the server.

A fan array with a plurality of fans is arranged between the hard disk drive array and the motherboard module for dissipating the generated heat. During operation, the fan array draws cool air from a front side of the server into the server. The cool air flows through the front area of the server to the rear area of the server to exchange heat within the server. Finally, the heated air is exhausted out of the server via through holes defined in the rear sidewall. However, the cool air drawn into the server may be adversely affected and may be heated by other modules arranged in the middle area of the server. Therefore, the cooling efficiency of the server may be substantially influenced.

Therefore, a server which can overcome the above-mentioned problems is desired.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Embodiments will now be described in detail below with reference to the drawings.

Figure 1:
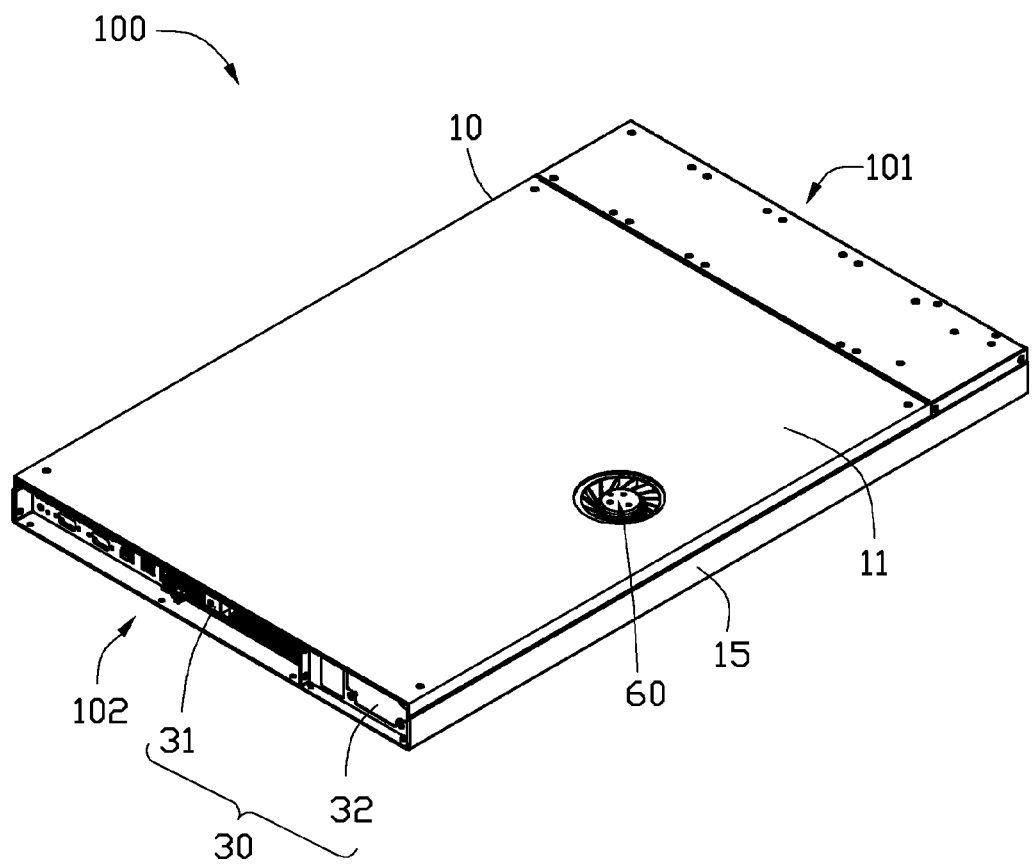
FIG. 1 is an isometric view of a server according to an exemplary embodiment.
Figure 2:
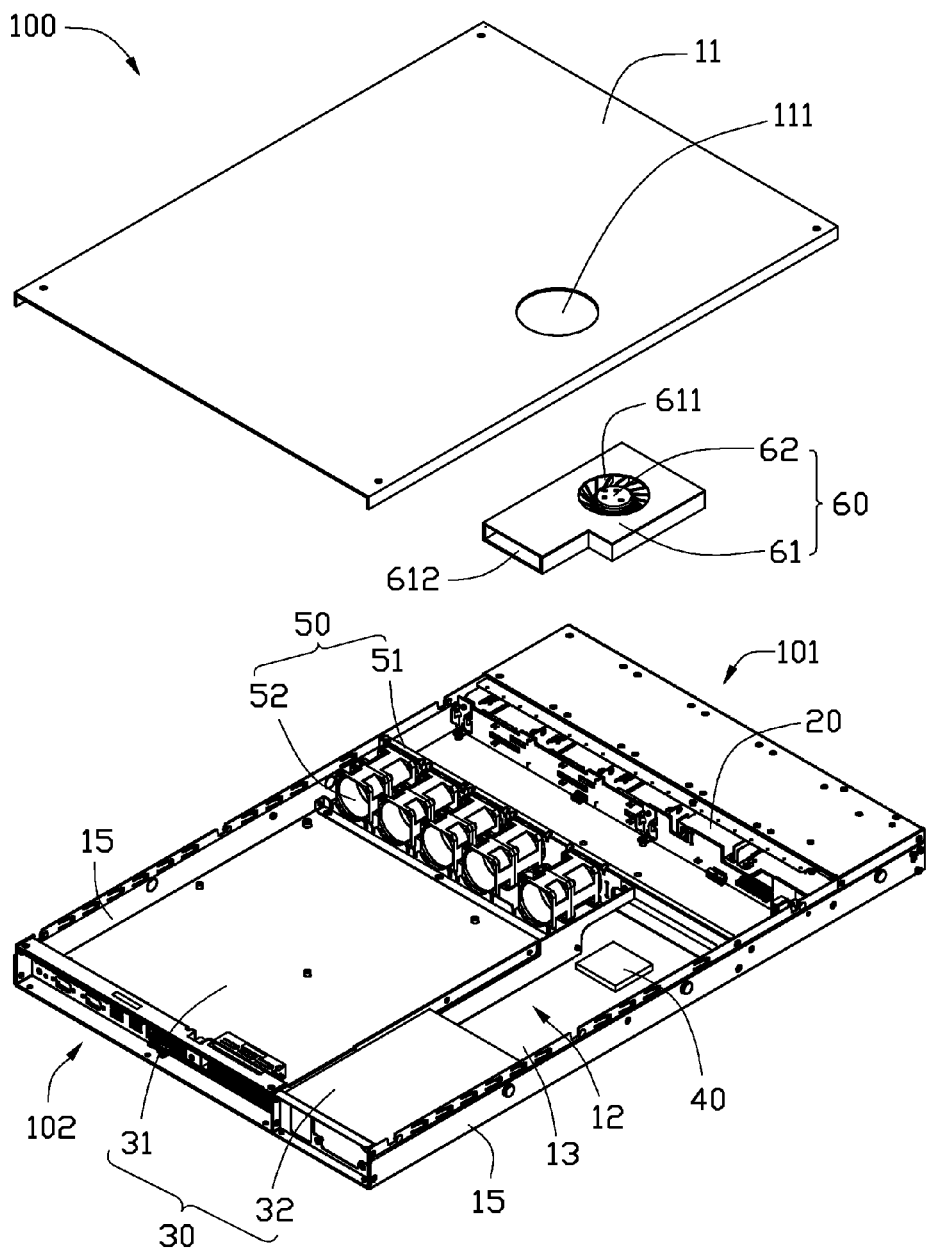
FIG. 2 is a partially exploded, isometric view of the server of FIG. 1, showing a second fan module arranged on the top of the server.

Referring to FIG. 1 and FIG. 2, a server 100 in accordance with an exemplary embodiment is provided. The server 100 includes a server enclosure 10, a first component module 20, a second component module 30, a third component module 40, a first fan module 50, and a second fan module 60.

The server enclosure 10 is used for accommodating the first component module 20, the second component module 30, the third component module 40, the first fan module 50, and the second fan module 60. The first component module 20, the second component module 30, and the third component module 40 are respectively arranged in different areas of the sever enclosure 10, and with different functions, such as data storing and data analyzing. The first fan module 50 and the second fan module 60 are arranged in the server enclosure 10, for evacuating the generated heat from the first component module 20, the second component module 30, and the third component module 40.

In this embodiment, the server enclosure 10 is rectangular parallelepiped. The server enclosure 10 includes a top plate 11, a bottom plate 13 opposite to the top plate 11, and two side plates 15 connected between the top plate 11 and the bottom plate 13. The top plate 11, the bottom plate 13, and the two side plates 15 cooperatively define an accommodating room 12. The top plate 11 defines a first intake hole 111. The first intake hole 111 communicates with the accommodating room 12. In this embodiment, the first intake hole 111 is positioned at the middle of the top plate 11, and near one of the side plates 15. The accommodating room 12 is used for accommodating the first component module 20, the second component module 30, the third component module 40, the first fan module 50, and the second fan module 60. The accommodating room 12 includes a front area 101, and a rear area 102 opposite to the front area 101. The bottom plate 13 is for supporting the first component module 20, the second component module 30, the third component module 40, and the first fan module 50.

The first component module 20 is arranged on the bottom plate 13, and located in the front area 101 of the server enclosure 10. In this embodiment, the first component module 20 includes a hard disk drive array with a plurality of hard disk drives (not shown).

The second component module 30 is arranged on the bottom plate 13, and located in the rear area 102 of the server enclosure 10. In this embodiment, the second component module 30 includes a motherboard module 31, and a power supply device 32.

The third component module 40 is arranged on the bottom plate 13, and located in the middle area (not labeled) of the accommodating room 12. In this embodiment, the third component module 40 includes a bus connector.

The first component module 20, the second component module 30, and the third component module 40 are electrically connected with each other, via a data cable or a power cable. Therefore, the first component module 20, the second component module 30, and the third component module 40 can operate together, and accomplish data transfer.

In operation, the first component module 20, the second component module 30, and the third component module 40 can generate heat.

The first fan module 50 is arranged on the bottom plate 13, and located between the first component module 20 and the second component module 30. The first fan module 50 draws cool air from outside into the accommodating room 12. The cool air flows through the front area 101 to the rear area 102 of the server enclosure 10 to exchange generated heat. Finally, the heated air is exhausted out of the server via the rear area 102. In this embodiment, the first fan module 50 includes a plurality of first fans 51 and first air-guiding housings 52. The first fans 51 are arranged abreast on the bottom plate 13, and adjacent to the first component 20. The air-guiding housings 52 are used for guiding the cool air drawn by the first fans 51. Therefore, the cool air can flow to the second component module 30 located in the rear area 102.

It is to be understood that the first fan module 50 is electrically connected with the power supply device 32.

The second fan module 60 is arranged on the top plate 11, and located in the accommodating room 12. The second fan module 60 includes a second air-guiding housing 61, and a second fan 62 positioned inside the second air-guiding housing 61. The second air-guiding housing 61 has a second intake hole 611, and an exhaust hole 612. The second intake hole 611 opens toward the first intake hole 111 of the top plate 11. The exhaust hole 612 opens toward the rear area 102 of the server enclosure 10. The second fan 62 draws cool air from outside into the accommodating room 12 through the first intake hole 111 and the second intake hole 611. The cool air flows along the second air-guiding housing 61 to the rear area 102 of the server enclosure 10 through the exhaust hole 612.

Figure 3:
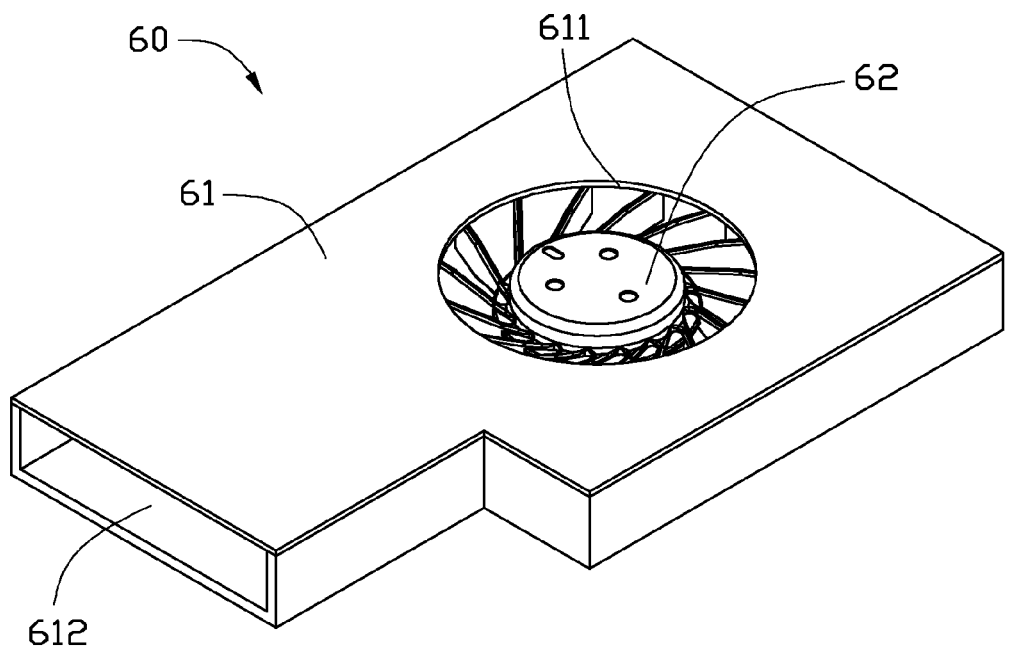
FIG. 3 is an isometric view of the second fan module of FIG. 2.

Referring to FIG. 3, in this embodiment, the second air-guiding housing 61 is substantially rectangular parallelepiped. The second intake hole 611 is defined in the top-wall of the second air-guiding housing 61. The exhaust hole 612 is defined in a side-wall of the second air-guiding housing 61. The central axis of the second intake hole 611 is perpendicular to the central axis of the exhaust hole 612. The top-wall of the second air-guiding housing 61 is attached to the inner side of the top plate 11. The second air-guiding housing 61 is away from the bottom plate 13. Therefore, there is a room between the second air-guiding housing 61 and the bottom plate 13, to accommodate other components, such as the first air-guiding housing 52. The second fan 62 is adjacent to the second intake hole 611. The rotating shaft of the second fan 62 is coaxial to the central axis of the second intake hole 611.

Furthermore, the server enclosure 10 has a blocking cover (not shown). The blocking cover is positioned on the top plate 11, to cover the first intake hole 111. Therefore, when the second fan 62 is shut down, the blocking cover can effectively block dust from going into the accommodating room 12.

Due to the second fan module 60 being arranged on the top plate 11, the server 100 can take in cool air from the top. The cool air can directly flow along the second air-guiding housing 61 to the second component module 30 in the rear area 102 of the server enclosure 10. Therefore, the cooling air drawn into the server 100 by the second fan module 60 may not be adversely affected and heated by the third component module 40 arranged in the middle area of the server 100. Accordingly, the cooling efficiency of the server may be substantially increased.

It is to be understood that the above-described embodiments are intended to illustrate rather than limit the disclosure. Variations may be made to the embodiments without departing from the spirit of the disclosure. The above-described embodiments illustrate the scope of the disclosure but do not restrict the scope of the disclosure.

What is claimed is:

1. A server, comprising:
   a server enclosure having an accommodating room and a top plate defining a first intake hole communicating with the accommodating room;
   a first component module arranged in the accommodating room at a front area thereof;
   a second component module comprising a motherboard module and a power supply device arranged side by side, the second component module arranged in the accommodating room at a rear area thereof;
   a third component module comprising a bus connector, the third component module arranged in a middle area of the accommodating room;
   a first fan module arranged in the accommodating room and located between the first component module and the motherboard module, the first fan module configured for forcing air to flow from the front area to the motherboard module at the rear area; and
   a second fan module arranged in the accommodating room and located between the bus connector and the power supply device, the second fan module comprising an air-guiding housing and a fan positioned inside the air-guiding housing, the air-guiding housing including a second intake hole aligned with the first intake hole, and an exhaust hole opening toward the power supply device at the rear area, the fan configured for drawing air outside the server enclosure through the first intake hole and the second intake hole, and blowing the air toward the power supply device at the rear area through the exhaust hole.

2. The server of claim 1, wherein the air-guiding housing is substantially a rectangular parallelepiped with all faces of the parallelepiped being rectangular.

3. The server of claim 2, wherein the second intake hole opens toward the first intake hole.

4. The server of claim 3, wherein the air-guiding housing is attached to the top plate.

5. The server of claim 1, wherein the server enclosure further comprises a bottom plate opposite to the top plate, and two side plates connected to the top plate and the bottom plate, and the top plate, the bottom plate and the side plates cooperatively define the accommodating room.

6. The server of claim 5, wherein the first component module, the second component module and the first fan module are mounted on the bottom plate.

7. The server of claim 6, wherein the third component module is mounted on the bottom plate.

8. The server of claim 1, wherein the first component module comprises an array of hard disk drives.

9. A server, comprising:
   a server enclosure with a front area and a rear area opposite to the front area, the server enclosure comprising:
      a top plate defining a first intake hole;
      a bottom plate opposite to the top plate; and
      two side plates connected to the top and bottom plates, the top plate, the bottom plate and the two side plates cooperatively defining an accommodating room communicating with the outside of the server enclosure through the first intake hole;
   a first component module mounted on a front area of the bottom plate;
   a second component module comprising a motherboard module and a power supply device arranged side by side, the second component module mounted on a rear area of the bottom plate;
   a third component module comprising a bus connector, the third component module mounted on a middle area of the bottom plate;
   a first fan module arranged in the accommodating room and located between the first component module and the motherboard module, and configured for forcing air to flow from the front area to the motherboard module at the rear area; and
   a second fan module arranged in the accommodating room and located between the bus connector and the power supply device, the second fan module comprising an air-guiding housing and a fan positioned inside the air-guiding housing, the air-guiding housing including a second intake hole aligned with the first intake hole, and an exhaust hole opening toward the power supply device at the rear area, the fan configured for drawing air outside the server enclosure through the first and second intake holes, and blowing the air toward the power supply device at the rear area through the exhaust hole.

10. The server of claim 9, wherein the first fan module is mounted on the bottom plate.

11. The server of claim 9, wherein the air-guiding housing is substantially a rectangular parallelepiped with all faces of the parallelepiped being rectangular.

12. The server of claim 11, wherein the second intake hole opens toward the first intake hole, and the exhaust hole opens toward the rear area.

13. The server of claim 12, wherein the air-guiding housing is attached to the top plate.

* * * * *